(12) United States Patent
Zhao et al.

(10) Patent No.: US 10,409,756 B2
(45) Date of Patent: Sep. 10, 2019

(54) MULTI-NODE SERVER PLATFORM WITH MODULARLY REPLACEABLE CARDS

(71) Applicant: Facebook, Inc., Menlo Park, CA (US)

(72) Inventors: Yan Zhao, Cupertino, CA (US); Hu Li, Fremont, CA (US); Jon Brian Ehlen, Newark, CA (US)

(73) Assignee: Facebook, Inc., Menlo Park, CA (US)

( * ) Notice: Subject to any disclaimer, the term of this patent is extended or adjusted under 35 U.S.C. 154(b) by 34 days.

(21) Appl. No.: 15/644,667

(22) Filed: Jul. 7, 2017

(65) Prior Publication Data
US 2019/0012288 A1 Jan. 10, 2019

(51) Int. Cl.
*G06F 13/40* (2006.01)
*G06F 13/42* (2006.01)
*G06F 1/26* (2006.01)

(52) U.S. Cl.
CPC .......... *G06F 13/4081* (2013.01); *G06F 1/266* (2013.01); *G06F 13/4282* (2013.01)

(58) Field of Classification Search
CPC ... G06F 1/266; G06F 13/4081; G06F 13/4282
See application file for complete search history.

(56) References Cited

U.S. PATENT DOCUMENTS

| | | | |
|---|---|---|---|
| 2008/0101351 A1* | 5/2008 | Nguyen | H04L 29/12839 370/389 |
| 2016/0062433 A1* | 3/2016 | York | G06F 1/266 713/310 |
| 2017/0269943 A1* | 9/2017 | Kumar | G06F 9/4416 |
| 2017/0322613 A1* | 11/2017 | Lin | G06F 1/3209 |
| 2018/0027685 A1* | 1/2018 | Miller | H03M 7/40 361/679.31 |
| 2018/0278468 A1* | 9/2018 | Rao | H04L 41/0659 |

* cited by examiner

*Primary Examiner* — Nimesh G Patel
(74) *Attorney, Agent, or Firm* — FisherBroyles, LLP

(57) ABSTRACT

Introduced here are multi-server sleds that include multiple card slots for receiving modular cards. Pairs of card slots can be connected to one another via a Peripheral Component Interconnect Express (PCIe) bus. However, communication via the PCIe bus may only be permitted when the pair of card slots includes modular cards of different types (e.g., a server card and a device card). Card type can be established by looking at the voltage available on a single pin of the PCIe bus corresponding to a modular card, and/or parsing system information stored within a memory of the modular card. This is enabled by a baseboard management controller (BMC) that communicates with the modular card via a bridge integrated circuit (IC) interface. Software-implemented modifications to the standard PCIe pin assignments may be made to avoid permitting communication between modular cards of the same type.

24 Claims, 11 Drawing Sheets

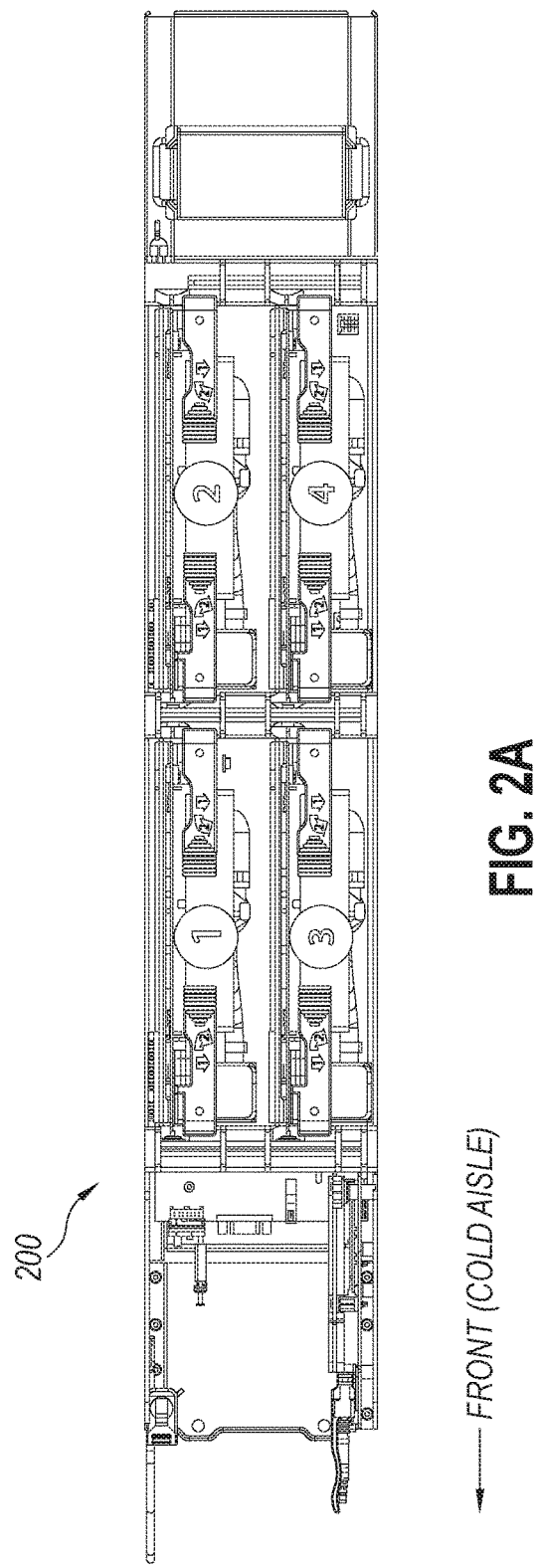

800

801 Detect a voltage available on a single pin of a PCIe bus corresponding to a card slot

802 Compare the voltage to a specified threshold

803 Determine that the modular card within the card slot is a server card if the voltage falls below the specified threshold

804 Determine that the modular card within the card slot is a device card if the voltage exceeds the specified threshold

805 Collect system information from an EEPROM on the modular card

806 Update the system information

807 Load the updated system information into the EEPROM on the modular card

808 Power the modular card by providing power to a corresponding power switch

FIG. 8

MULTI-NODE SERVER PLATFORM WITH MODULARLY REPLACEABLE CARDS

FIELD OF THE INVENTION

Various embodiments pertain to a multi-node server platform and, more specifically, to sleds for multi-node server platforms that have multiple card slots for receiving modular cards.

BACKGROUND

In hardware design, there are at least two different approaches to solving the vast computing needs of a social networking website—"scaling up" and "scaling out." Scaling up requires that ever-increasing amounts of computing power are built into a given computing system, while scaling out requires that an ever-increasing fleet of simple computing systems (each with a moderate amount of computing power) be built.

For example, two-socket (2S) computing platforms, which have long been the mainstream server architecture, have become scale-up computing systems. Multiple high-performance processors ensure that 2S computing platforms are strong and versatile. However, the high-performance processors are also bulky and power hungry. Consequently, 2S computing platforms are not optimized for scale-out computing systems.

Moreover, many conventional server architectures include a single printed circuit board (PCB) assembly that has multiple servers. But such a design requires that the entire PCB assembly be replaced if a single server fails. Accordingly, there is a need for an easily serviceable server platform that uses space more efficiently and provides greater flexibility.

BRIEF DESCRIPTION OF THE DRAWINGS

Embodiments of the multi-node server platform (also referred to herein as simply "the embodiments") are illustrated by way of example and not limitation in the accompanying drawings, in which like references indicate similar elements. Various objects, features, and characteristics of the embodiments will become more apparent to those skilled in the art from a study of the Detailed Description in conjunction with the accompanying drawings.

FIG. 2A is a schematic diagram illustrating how each multi-server sled includes a baseboard that has multiple card slots configured to receive modular cards.

FIG. 8 is a flow diagram of a process for discovering the type of modular card installed in a card slot of a baseboard.

Figure 1:
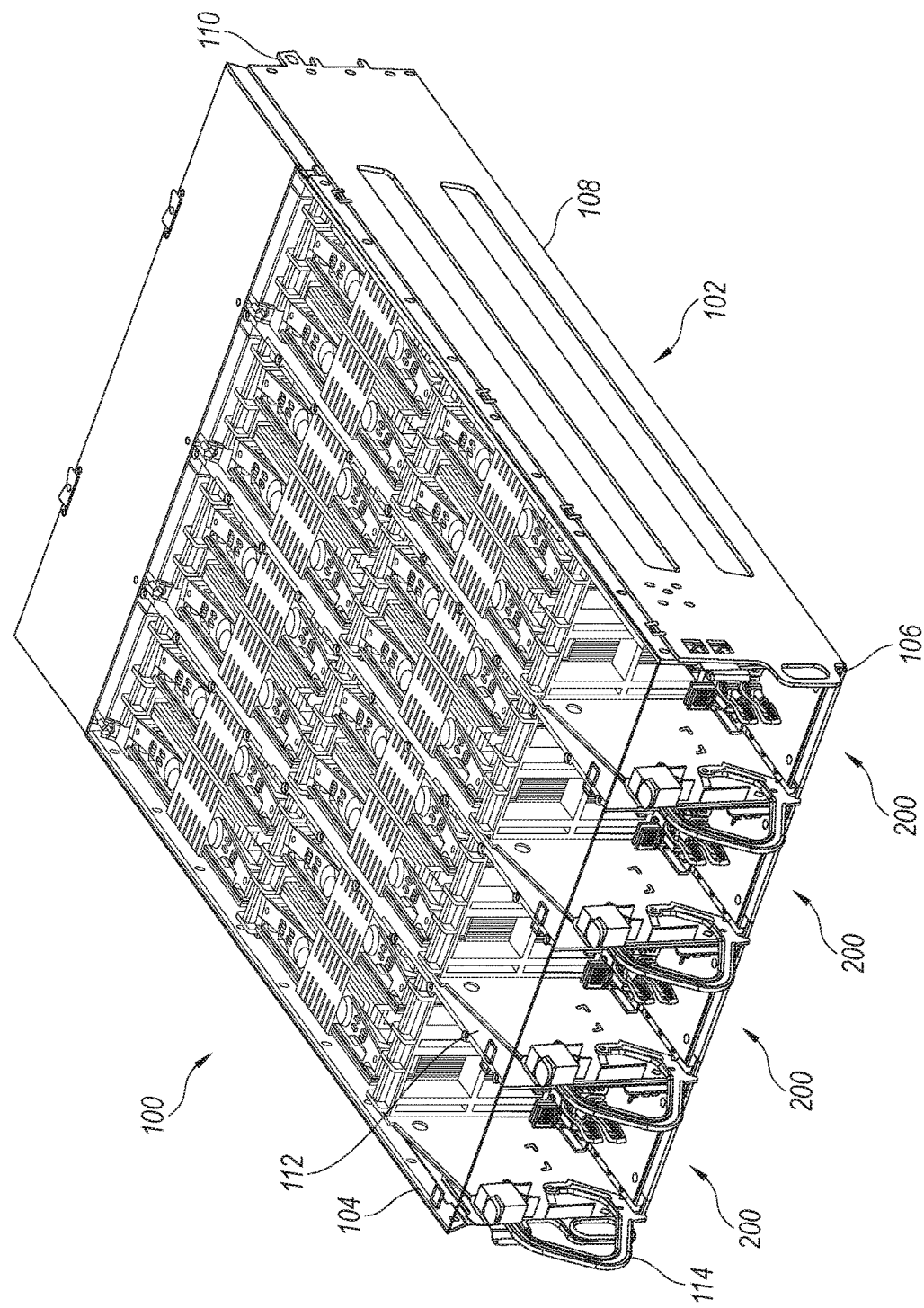
FIG. 1 is a schematic diagram illustrating a multi-node server platform that includes a cubby chassis.

The figures depict various embodiments for the purpose of illustration only. Those skilled in the art will recognize that alternative embodiments may be employed without departing from the principles of the technology.

DETAILED DESCRIPTION

Introduced here are multi-node server platforms (also referred to as "multi-node compute platforms") having a modular chassis design that includes a cubby chassis housing one or more multi-server sleds. Each multi-server sled includes a baseboard that has multiple card slots for receiving modular cards.

For example, in some embodiments a multi-server sled includes four one-socket (1S) server cards, while in other embodiments the multi-server sled includes two 1S server cards and two device cards, and in yet other embodiments the multi-server sled includes three 1S server cards and one device card. The 1S server cards may be Open Compute Platform (OCP) compliant. Examples of device cards include graphical processing unit (GPU) cards, field-programmable gate array (FPGA) cards, solid state drive (SSD) cards, flash storage cards, and other Peripheral Component Interconnect Express (PCIe) add-in cards.

The horizontally-installed baseboard resides within the cubby chassis and can hold the modular cards in a vertical orientation. Such a design permits high-powered system-on-a-chip (SoC) processor cards to be used that support the capacity to scale out computing power with demand.

A baseboard management controller (BMC) on the baseboard is used to manage the modular cards (e.g., device cards and/or server cards). The BMC can support both in-band management and out-of-band (OOB) management so that the BMC can be accessed from the server cards on the multi-server sled, from an external server on the network, or both.

Each card slot (and thus each modular card) can be connected to a multi-host network interface controller (NIC) (e.g., a 50G or 100G NIC). However, each card slot may be associated with a corresponding network interface to provide independent network access. To simplify cabling, only a single network cable may be used to connect the multi-server sled to a top-of-rack (TOR) switch accessible to the multi-node server platform.

Each cubby chassis of the multi-node server platform may include a power connector that receives power from a component rack. Each multi-server sled may include a corresponding power connector that interfaces with, and receives power from, the cubby chassis. Because each card slot on the sled is associated with a dedicated power switch, the BMC can controllably and independently delivery power to each card slot. Consequently, the BMC may do full alternating current (AC) power cycling to some or all modular cards when needed. The BMC may also monitor the health status of each modular card and take appropriate action when failures occur. For example, the BMC may monitor power, voltage, current, temperature, fan speed, etc.

The multi-server sleds of a multi-node server platform can also support hot service. More specifically, a hot swap controller connected to the BMC can enable the modular cards installed in the baseboard of the multi-server sled to continue operating when the multi-server sled is pulled out of the cubby chassis for service. Previous designs of multi-node server platforms were designed in such a manner that all servers would lose power even if only a single server required repair.

Each server node on the multi-server sled can be defined as a pluggable module that holds, for example, an SoC processor card with one or more memory channels (e.g., having double data rate (DDR) dual in-line memory module (DIMM) slots), one or more local interfaces (e.g., SSD interfaces), and a local management controller. Module interfaces may also be standardized so that compliant modular cards and computing systems can interoperate. In some embodiments, a shared network connection providing both data and management traffic can be used to simplify external connectivity for each module.

TERMINOLOGY

Brief definitions of terms, abbreviations, and phrases used throughout the specification are given below.

Reference in this specification to "one embodiment" or "an embodiment" means that a particular feature, structure, or characteristic described in connection with the embodiment is included in at least one embodiment of the disclosure. The appearances of the phrase "in some embodiments" are not necessarily referring to the same embodiments, nor are they necessarily referring to separate or alternative embodiments that are mutually exclusive of one another. Moreover, various features are described that may be exhibited by some embodiments but not others. Similarly, various requirements are described that may be requirements for some embodiments but not others.

Unless the context clearly requires otherwise, the words "comprise" and "comprising" are to be construed in an inclusive sense rather than an exclusive or exhaustive sense (i.e., in the sense of "including, but not limited to"). The terms "connected," "coupled," or any variant thereof includes any connection or coupling between two or more elements, either direct or indirect. The coupling or connection between the elements can be physical, logical, or a combination thereof. For example, two devices may be coupled directly to one another or via one or more intermediary channels/devices. Devices may also be coupled in such a way that information can be passed there between, despite not sharing any physical connection with one another. The words "associate with," meanwhile, mean connecting or relating objects, items, etc.

Where the context permits, words used in the singular sense or the plural sense may also be used in the plural sense or the singular sense, respectively. The word "or," in reference to a list of two or more items, covers all of the following interpretations of the word: any of the items in the list, all of the items in the list, and any combination of the items in the list. If the specification states a component or feature "may," "can," "could," or "might" be included or have a characteristic, that particular component or feature is not required to be included or have the characteristic in every embodiment.

The term "module" refers broadly to software, hardware, and/or firmware components. Modules are typically functional components that can generate useful data or other output using specified input(s). A module may or may not be self-contained. A software program or application may include one or more modules.

The terminology used in the Detailed Description is intended to be interpreted in its broadest reasonable manner, even though it is being used in conjunction with certain embodiments. The terms used in this specification generally have their ordinary meanings in the art, in the context of the disclosure as a whole and in the specific context where each term is used. For convenience, certain terms may be highlighted using, for example, capitalization, italics, and/or quotation marks. However, the use of highlighting has no influence on the scope and meaning of a term. The scope and meaning of a term is the same, in the same context, whether or not it is highlighted.

Consequently, although alternative language and synonyms may be used for some terms, special significance is not to be placed upon whether or not a term is elaborated or discussed herein. A recital of one or more synonyms does not exclude the use of other synonyms. The use of examples anywhere in this specification, including examples of any terms discussed herein, is intended to be illustrative only. These examples are not intended to limit the scope and meaning of the disclosure or of any exemplified term. Likewise, the disclosure is not limited to the various embodiments described below.

System Topology Overview

FIG. 1 is a schematic diagram illustrating a multi-node server platform 100 that includes a cubby chassis 102. The cubby chassis 102 is configured to mount into a component rack (not shown) and house one or more multi-server sleds 200. The cubby chassis 102 may be a sheet metal chassis. The cubby chassis 102 can also include multiple sled slots that are sized and configured to receive a multi-server sled 200 in each slot. Here, for example, the cubby chassis 102 includes four sled slots for receiving multi-server sleds 200.

Some embodiments of the cubby chassis 102 allow the multi-server sleds to be moved between two sled positions (e.g., an operational position in which the multi-server sled 200 is housed entirely within the cubby chassis 102, and a servicing position in which at least a portion of the multi-server sled 200 is exposed), while other embodiments may include a greater or fewer number of sled positions. For example, a handle 114 may be used to engage/disengage latches that cause the multi-server sleds 200 to be securably retained within the cubby chassis 102.

The cubby chassis 102 includes a top panel 104 and a bottom panel 106 that are spaced apart by sidewalls 108 and an end wall 110. In some embodiments, partitions 112 are positioned between the top panel 104 and the bottom panel 106 to divide the cubby chassis 102 into the multiple sled positions 122. For example a pair of partitions may divide the cubby chassis 110 into three sled positions.

Figure 2B:
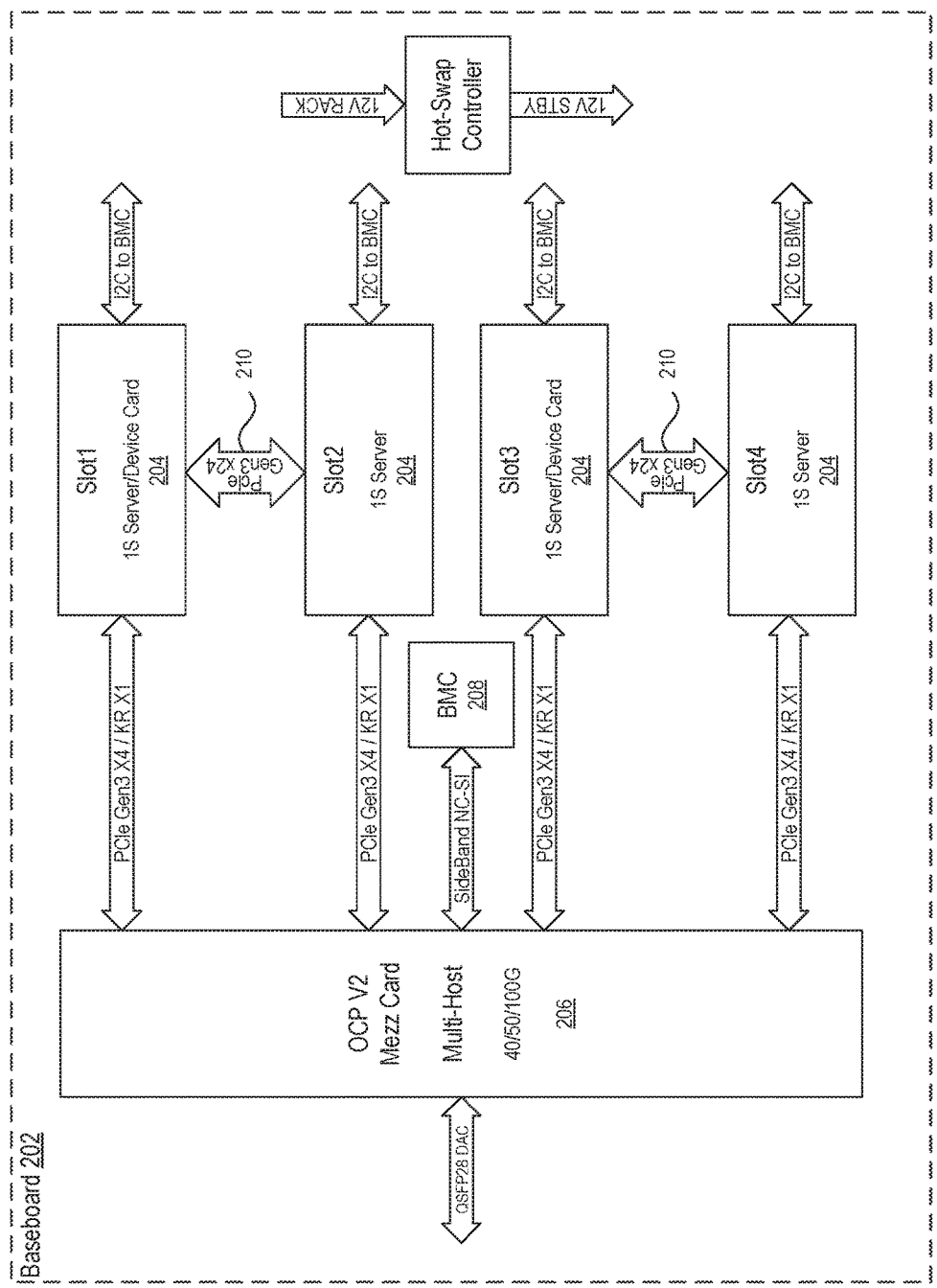
FIG. 2B is a functional block diagram of a baseboard.

Each multi-server sled 200 includes a baseboard 202 that has multiple card slots 204 configured to receive modular cards, as shown in FIG. 2A. While the baseboard 202 shown here includes four card slots, other embodiments may include a greater or fewer number of card slots. FIG. 2B is a functional block diagram of the baseboard 202.

Each card slot 204 is communicatively coupled to a printed circuit board (PCB) assembly of the baseboard 202. For example, each card slot 204 may be connected to a multi-host mezzanine card 206 (also referred to as a "shared mezzanine card") via a PCIe bus. The multi-host mezzanine card 206 may be configured for 40G, 50G, or 100G. In some embodiments, the multi-host mezzanine card 206 is a Peripheral Component Interconnect (PCI) mezzanine card manufactured in accordance with the Institute of Electrical and Electronics Engineers (IEEE) P1386.1 standard.

Moreover, each card slot 204 may be connected to a baseboard management controller (BMC) 208 via an inter-integrated circuit ($I^2C$) bus that allows the BMC 208 to communicate with each card slot 204 on an individual basis. The BMC 208 is used to controllably manage individual components of the baseboard 202, including the modular cards installed within the card slots 204. The BMC 208 may support both in-band management and OOB management so that the BMC 208 can be accessed from the modular cards installed on the baseboard 202, from an external server on the network, or both.

Several different card configurations can be created by placing modular cards of different types in the multiple card slots 204. For example, in one embodiment a multi-server sled includes four 1S server cards, while in another embodiment the multi-server sled includes two 1S server cards and two device cards, and in yet another embodiment the multi-server sled includes three 1S server cards and one device card. The 1S server cards may be OCP compliant. Examples of device cards include GPU cards, FPGA cards, SSD carrier cards, flash storage cards, and other PCIe add-in cards.

However, these variable card configurations require that the multiple card slots 204 be defined into pairs of card slots able to communicate with one another. As shown in FIG. 2B, each pair of card slots is connected via a Peripheral Component Interconnect Express (PCIe) bus 210. Each pair of card slots typically includes one card slot dedicated to receiving a server card (e.g., card slot 2 and card slot 4) and one card slot capable of receiving a server card or a device card (e.g., card slot 1 and card slot 3).

Because there are multiple possible card configurations, it is preferable for the baseboard 202 to configure itself automatically. Accordingly, the BMC may collect system information from a memory associated with the modular card installed within each card slot 204 in order to identify a current card configuration during initialization of the baseboard 202. In general, the BMC should cause server cards to disable PCIe ports to prevent communication via the PCIe bus 210.

In some embodiments, the BMC also loads updated system information into the memory of a server card. The updated system information may include software-implemented pin assignment modifications to a PCIe standard employed by the server card. The software-implemented pin assignment modifications ensure that the server card is able to engage necessary input/output (I/O) terminals, disengage incompatible I/O terminals, or both. Such action allows a pair of server cards to avoid collisions that are produced when server cards attempt to use each other as device cards (and thus ending up with an invalid state).

Figure 3A:
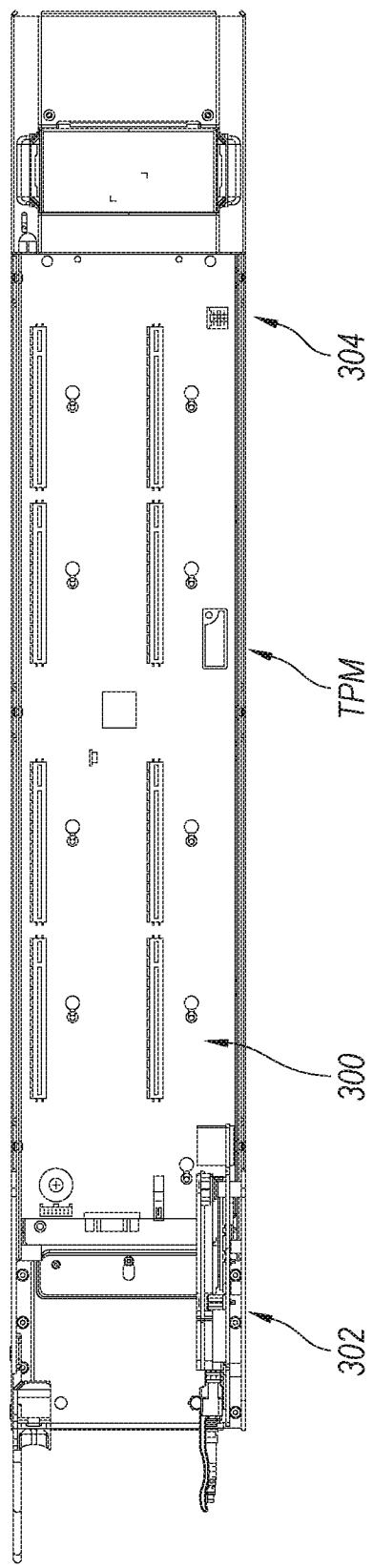
FIG. 3A is a schematic diagram illustrating how the baseboard of a multi-server sled can be used to hold various connectors and infrastructure pieces, including primary/extension connectors for holding the modular cards within the card slots, a mezzanine card through an adapter card, an inlet power connector, a baseboard management controller (BMC) section, one or more fan connectors, a hot swap controller, and/or a front panel.

FIG. 3A is a schematic diagram illustrating how the baseboard 300 of a multi-server sled can be used to hold various connectors and infrastructure pieces, including primary/extension connectors for holding the modular cards within the card slots, a mezzanine card through an adapter card, an inlet power connector, a BMC section, one or more fan connectors 304, a hot swap controller, and/or a front panel. Additional primary/extension connectors (as well as other structure features of multi-node server platforms) are described in U.S. patent application Ser. No. 15/063,024 titled "Multi-Node Server Platform" and filed on Mar. 7, 2016, which is incorporated by reference herein in its entirety.

As noted above, the baseboard 300 can be installed horizontally within a cubby chassis. Modular cards (e.g., server cards and device cards) can be installed into card slots defined in the baseboard in a vertical orientation with proper holder(s). Such a design permits high-powered SoC processor cards to be used that support the capacity to scale out computing power with demand. For example, the modular cards may include OCP-compliant 1S server cards having a height of 110 mm or 160 mm.

The BMC (not shown) is the main control unit on the baseboard 300. In some embodiments, an adapter card at the front of the multi-server sled is used as a carrier board for one or more mezzanine cards. The mezzanine connectors on the adapter card may be designed in such a way as to take a PCIe-based multi-host mezzanine card or a mezzanine card that connects to a server card's built-in network interface card (NIC) as the Ethernet interface to the external world. Either way, the NIC can be used as a shared NIC so that the BMC can be accessed via an OOB port of the NIC, a Network Controller Sideband Interface (NC-SI), and/or a System Management Bus (SMBus).

Figure 3B:
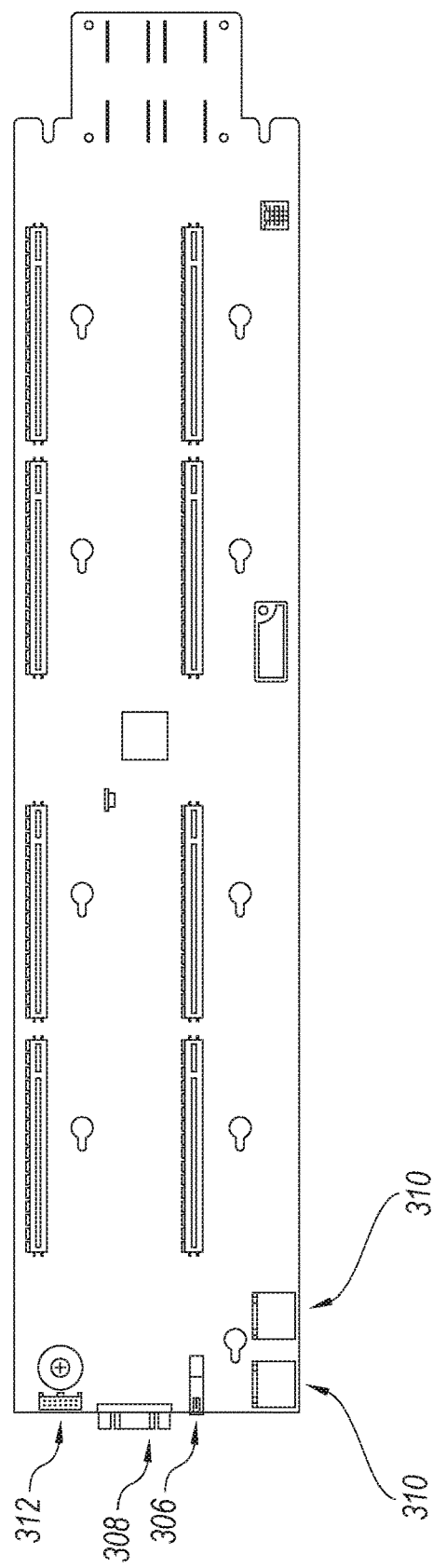
FIG. 3B is a schematic diagram illustrating several of the input/output (I/O) terminals of the baseboard.

FIG. 3B, meanwhile, is a schematic diagram illustrating several of the input/output (I/O) terminals of the baseboard 300. Various embodiments of the baseboard can include a power button, a reset button, a Universal Serial Bus (USB) connector 306, a video graphics array (VGA) connector 308, one or more NIC adapter connectors 310 for interfacing with a corresponding NIC adapter 302, and/or a debug card header 312 at the front panel of the baseboard. Each of these components may belong to the current active server on the multi-server sled. These components also provide greater control over individual components of the multi-server sled. For example, a user may be able to turn a rotary switch to select a specific server card as the current active server.

In some embodiments, there are one or more fan tray connectors 304 and an inlet power connector (not shown) on the backside of the baseboard to provide cooling and power. The fan tray connector(s) 304 and the inlet power connector may remain engaged even when the multi-server sled is removed from the cubby chassis for servicing. That is, cooling and/or power may continue to be provided even when a portion of the multi-server sled is exposed from the cubby chassis.

Figure 4:
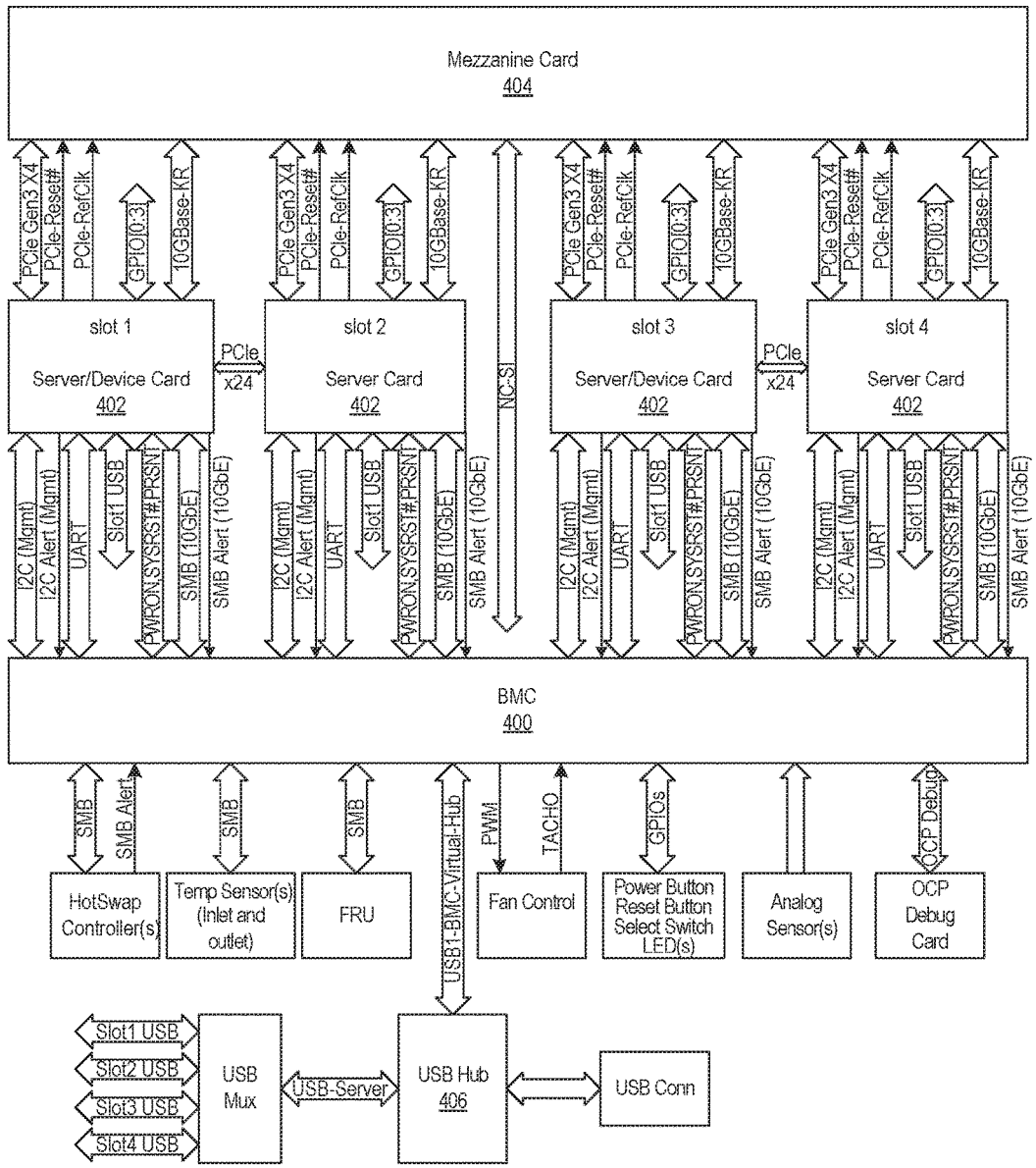
FIG. 4 is a functional block diagram illustrating the communication channels between different components of a multi-server sled that includes multiple card slots for receiving modular cards.

FIG. 4 is a functional block diagram illustrating the communication channels between different components of a multi-server sled that includes multiple card slots 402 for receiving modular cards. For example, in some embodiments the multi-server sled includes four 1S server cards, while in other embodiments the multi-server sled includes two 1S server cards and two device cards.

A BMC 400 is used to manage the modular cards (e.g., device cards and/or server cards) and typically has two possible network paths. First, if a PCIe-based multi-host NIC mezzanine card 404 is used, the BMC 400 can use its built-in media access controller (MAC) to transfer management traffic through an NC-SI interface with a TOR switch. Second, if a multi-node server platform only has a PHY card on the mezzanine slot and uses the server card's built-in NICs, then the BMC 400 can use the SMBus connections going from the BMC 400 to each card slot 402 for OOB management traffic. Therefore, the mezzanine card 404 will typically need to provide a Field Replaceable Unit identifier (FRUID) that can be used by the BMC 400 to identify card type and configure network paths accordingly. Unused interface(s)/device(s) are generally disabled so that they do not interfere with the activated interface(s)/device(s).

The BMC 400 can support both in-band management and OOB management so that the BMC 400 can be accessed from each card slot 402 on the multi-server sled, from an external server on the network (e.g., via the mezzanine card 404 or the USB hub/interface 406), or both. For example, the BMC 400 may be directly accessible via an OOB port of a multi-host NIC, a Network Controller Sideband Interface (NC-SI), or a System Management Bus (SMBus).

Figure 5:
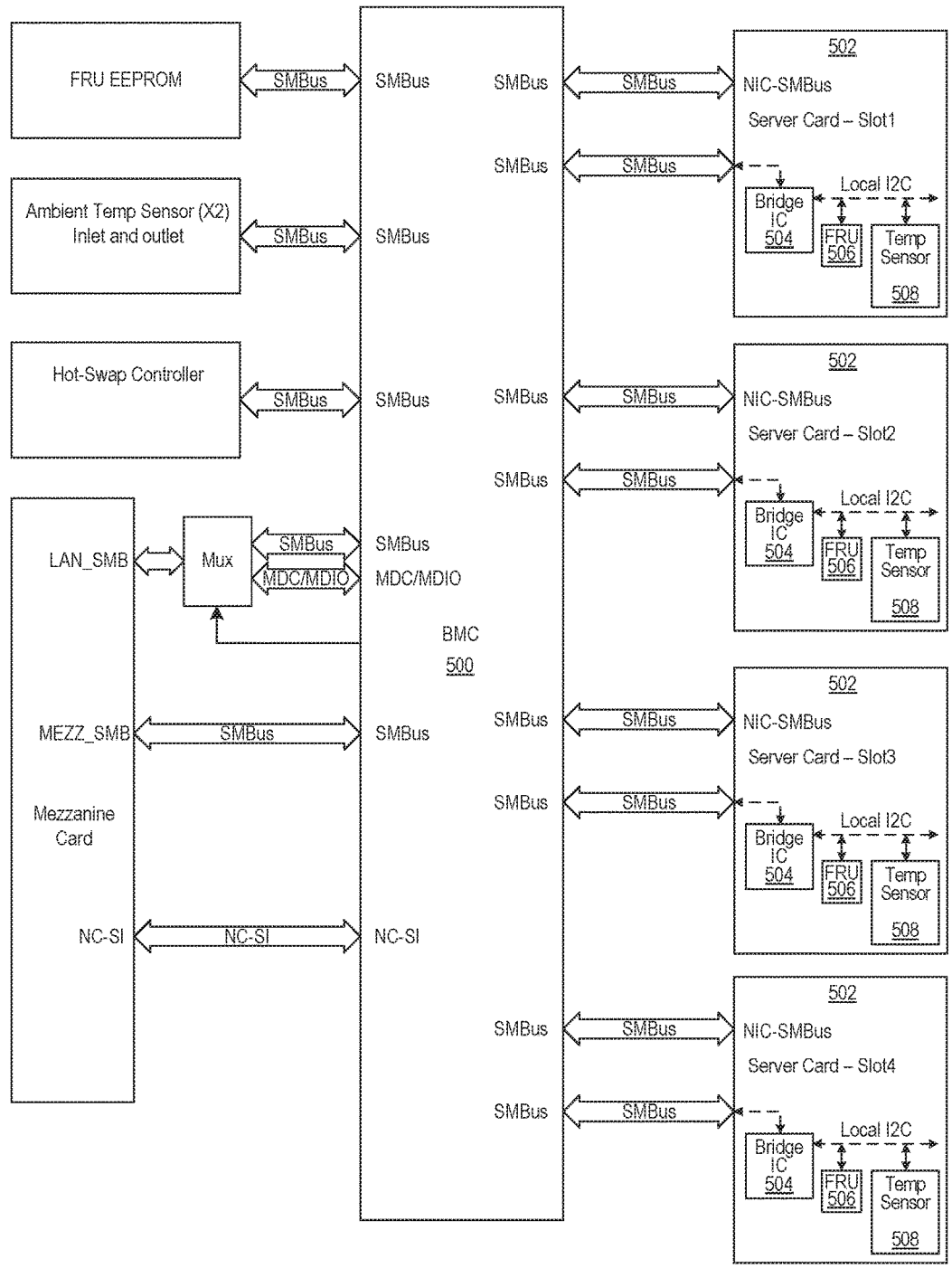
FIG. 5 is a functional block diagram illustrating how the BMC can communicate with each modular card via a bridge integrated circuit (IC) interface.

Moreover, each card slot 402 (and thus each modular card) may be associated with a corresponding network interface to provide independent network access. FIG. 5, for example, is a functional block diagram illustrating how the BMC 500 can communicate with the modular card installed within each card slot 502 via a bridge integrated circuit (IC) interface 504. The BMC 500 may use the bridge IC interface 504 to communicate with the central processing unit (CPU), memory (e.g., an EEPROM), sensor(s) (e.g., temperature sensors 508), etc.

The multi-server sled may contain various Field Replaceable Units 506 (FRUs), including a Side Plane Board (SPB), mezzanine card, and modular cards. Each of these FRUs can include an electrically erasable programmable read-only memory (EEPROM) that contains static information (e.g., port assignments, manufacturer name, manufacturing date, part number, serial number, asset tag). As further described below, the static information can be parsed by the BMC 500 to understand the type of FRU that is in place. For example, the BMC 500 may parse the static information stored in the FRU EEPROM of a modular card to establish the type of modular card installed in a particular card slot and provide service(s) accordingly.

In some embodiments, one or more sensors reside on the multi-server sled on or near the various FRUs. For example, the sensor(s) may be installed on the baseboard, the modular card(s), the mezzanine card, etc. The sensor(s) generate sensor data indicative of current measurements, power measurements, voltage measurements, temperature measurements, etc. For example, each modular card may include a temperature sensor 508 that stores temperature data in a corresponding FRU EEPROM as shown in FIG. 5. The BMC can periodically or continually retrieve the sensor data, and then execute a computer program (e.g., a daemon) the parses the sensor data and compares the sensor data against specified threshold values. By sampling the sensor data, the BMC can continuously monitor the health status of the multi-server sled from different perspectives. The BMC may log an error message in case of a threshold violation.

Figure 6:
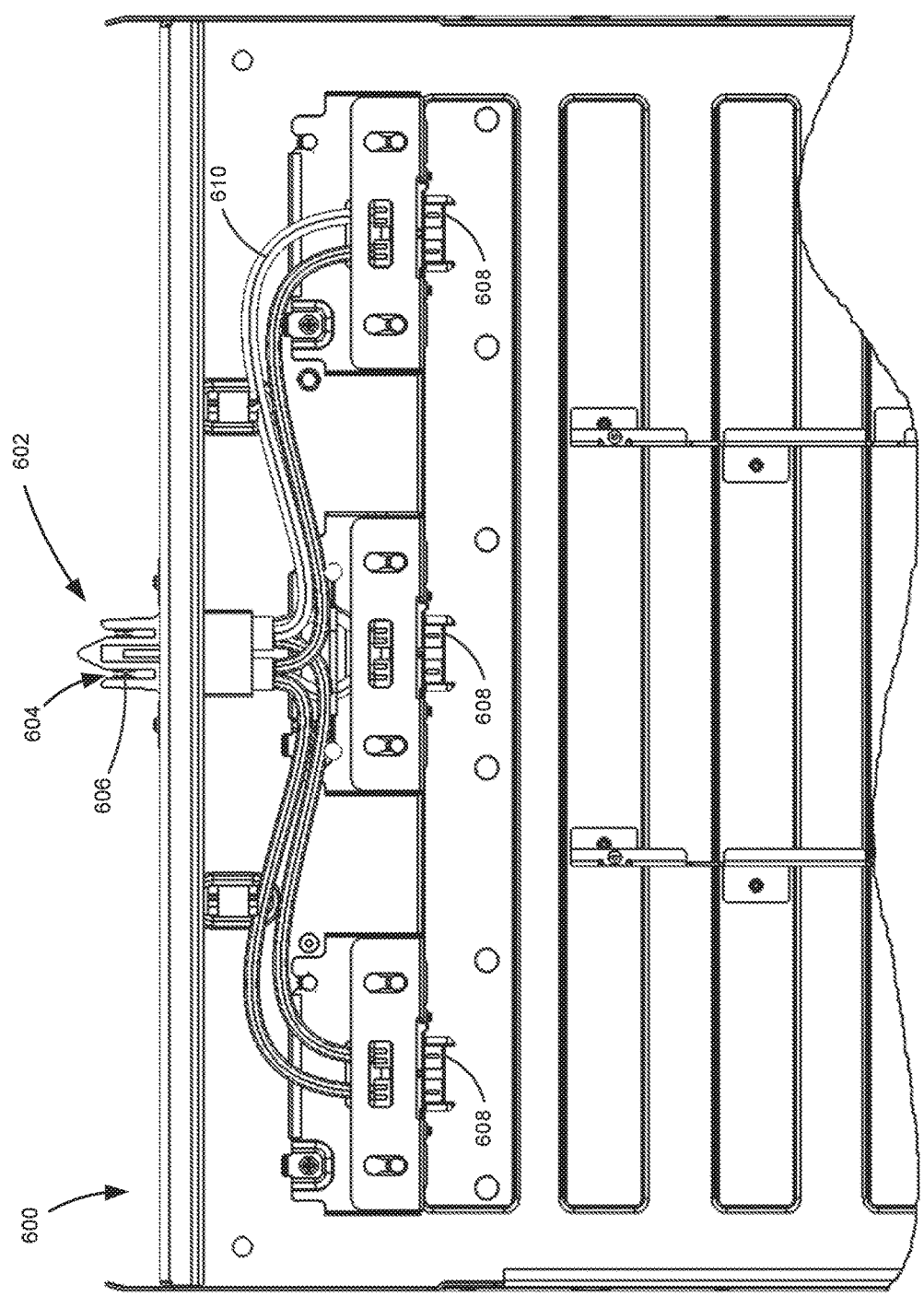
FIG. 6 is a schematic diagram illustrating how a cubby chassis can include a power input connector that is attached to the end wall of the cubby chassis.

FIG. 6 is a schematic diagram illustrating how a cubby chassis 600 can include a power input connector 602 that is attached to the end wall of the cubby chassis 600. In some embodiments, the power input connector 602 includes a pair of slots 604 containing contacts 606 that engage or clip onto a corresponding power bus bar (not shown). The power input connector 602 can be connected to multiple cubby connectors 608 via a power cable assembly 610.

Each multi-server sled housed within the cubby chassis 600 may include a corresponding power connector that interfaces with, and receives power from, a cubby connector 608. Each card slot on the multi-server sled is typically associated with a dedicated power switch, so the BMC can independently delivery power received at the corresponding power connect to each card slot. For example, the BMC may be configured to controllably deliver up to 12V to each card slot.

Figure 7:
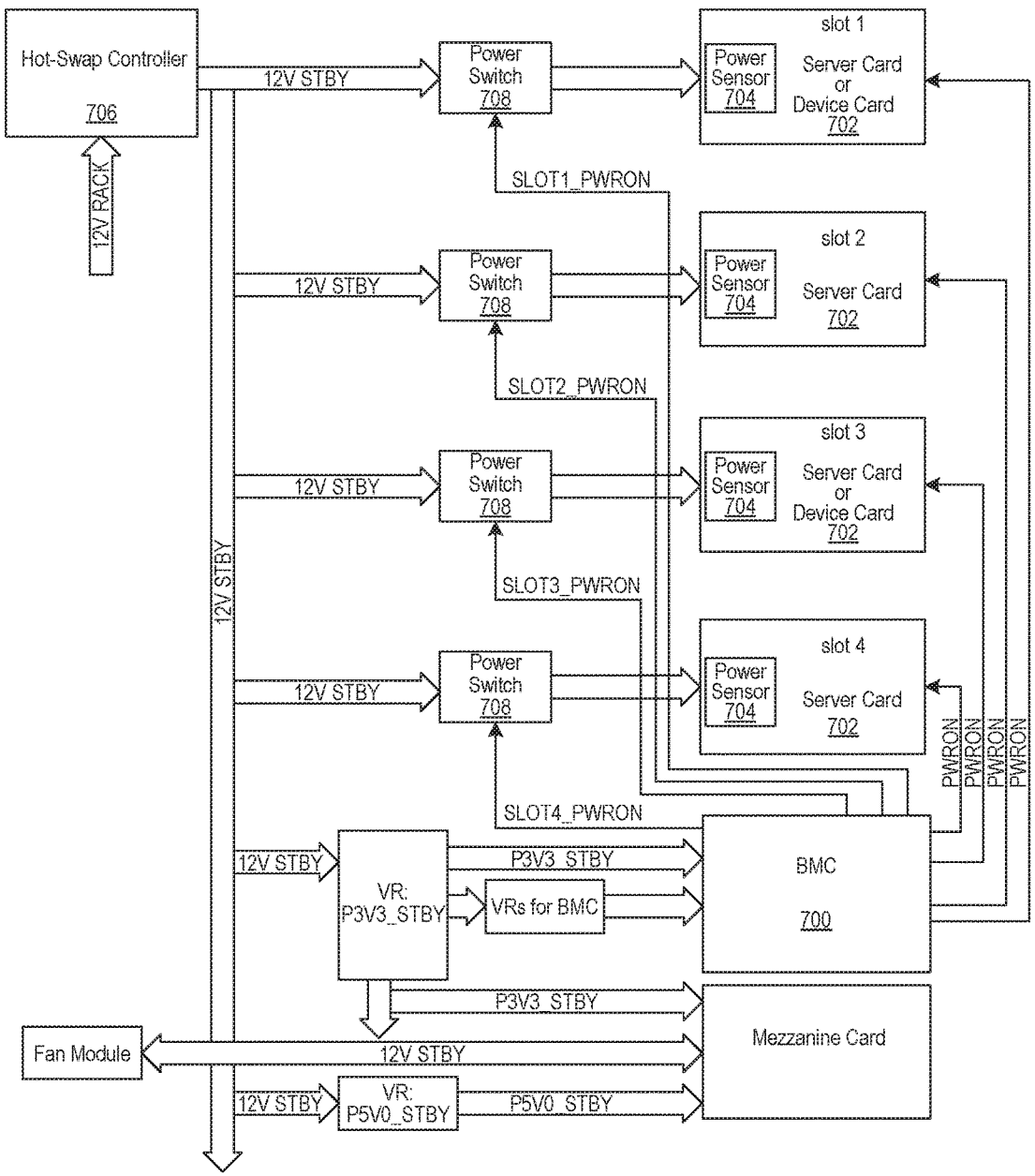
FIG. 7 is a functional block diagram illustrating the power channels between different components of a multi-server sled.

FIG. 7 is a functional block diagram illustrating the power channels between different components of a multi-server sled. As noted above, the cubby chassis of a multi-node server platform may include a power input connector that receives power from a component rack, while each multi-server sled may include a power connector that interfaces with, and receives power from, a corresponding power connector of the cubby chassis.

Because each card slot on the multi-sever sled is associated with a dedicated power switch 718, the BMC 700 may be configured to do full alternating current (AC) power cycling to some or all of the modular cards installed within the card slots 702 when needed. The BMC 700 may also monitor the health status of each modular card, and take appropriate action when failures occur. For example, if BMC 700 determines that a measurements generated by a power sensor 704 or a temperature sensor exceed a specified threshold, the BMC 700 may throttle the power to reduce the likelihood of a failure. The BMC 700 may monitor power, voltage, current, temperature, fan speed, etc.

In some embodiments, the BMC 700 is connected to a hot swap controller 706 via an I$^2$C bus, which allows the BMC 700 to gauge sled-wide power consumption and ensure a healthy power status is maintained. The hot swap controller 706 allows the multi-node server platforms described herein to support hot service. More specifically, the hot swap controller 706 connected to the BMC 700 can enable the modular cards installed in the multi-server sled to continue operating when the multi-server sled is pulled out of the cubby chassis for service. Previous designs of multi-node server platforms were designed in such a manner that all servers would lose power even if only a single server required repair.

FIG. 8 is a flow diagram of a process 800 for discovering the type of modular card installed in a card slot of a baseboard. The process 800 is typically performed during or immediately after initialization of a baseboard management controller (BMC) of the baseboard.

Initially, the BMC detects a voltage available on a single pin of a PCIe bus corresponding to the card slot (step 801). The BMC can then compare the voltage to a specified threshold (step 802) in order to determine the type of modular card installed in the card slot.

For example, the BMC may determine that the modular card is a server card if the voltage falls below the specified threshold (step 803), and the BMC may determine that the modular card is a device card if the voltage exceeds the specified threshold (step 804). Other embodiments may involve more granular voltage comparisons. For instance, a voltage measurement of 0V may be indicative of a server card, while a voltage measurement of 1V may be indicative of a device card, and a voltage measurement of 1.8V may be indicative of a special device card. Those skilled in the art will recognize that these voltage measurements have been provided for the purpose illustration only.

The BMC can also collect system information from an EEPROM on the modular card (step 805). The system information may specify card characteristic(s) that assist the BMC in discovering the type of modular card installed in the card slot. The EEPROM may be a FRU EEPROM.

In some embodiments, the BMC updates the system information (step 806) and loads the updated system information into the EEPROM on the modular card (step 807). For example, if the BMC determines that a server card is installed in the card slot, the BMC may update modify pin assignments associated with a PCIe standard employed by the server card. That is, the updated system information can include software-implemented pin assignment modifications to a PCIe standard employed by the server card in order to prevent communication between the server card and another modular card via a PCIe bus. Thus, the software-implemented pin assignment modifications can ensure that the server card is able to engage necessary I/O terminals and/or disengage incompatible I/O terminals.

The BMC can then power the modular card by providing power to a corresponding power switch (step 808). Powering of the modular card can be performed responsive to receiving user input indicative of a request to activate the server card, in accordance with a specified power policy configuration (e.g., always-off, always-on, last-power-state).

Unless contrary to physical possibility, it is envisioned that the steps described above may be performed in various sequences and combinations. For example, in some embodiments the BMC may collect system information from the EEPROM of the modular card prior to detecting the voltage available on the pin of the PCIe bus.

Additional steps could also be included in some embodiments. For example, the BMC may also be configured to analyze sensor data generated by sensor(s) disposed proximate to the baseboard in order to monitor a function status, a power status, a thermal status, etc.

Processing System

Figure 9:
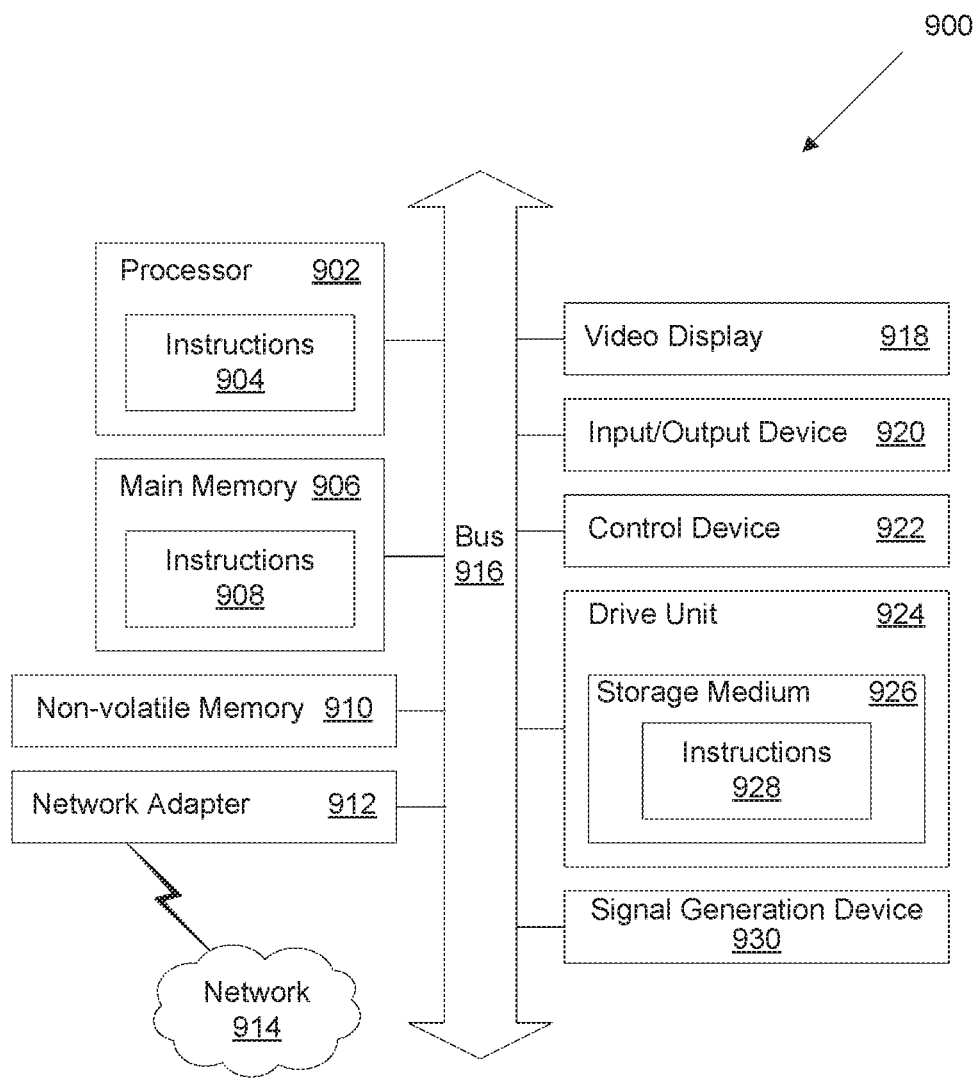
FIG. 9 is a block diagram illustrating an example of a processing system in which at least some operations described herein can be implemented.

FIG. 9 is a block diagram illustrating an example of a processing system 900 in which at least some operations described herein can be implemented. The processing system may include one or more central processing units ("processors") 902, main memory 906, non-volatile memory 910, network adapter 912 (e.g., network interfaces), video display 918, input/output devices 920, control device 922 (e.g., keyboard and pointing devices), drive unit 924 including a storage medium 926, and signal generation device 930 that are communicatively connected to a bus 916.

The bus 916 is illustrated as an abstraction that represents one or more physical buses and/or point-to-point connections that are connected by appropriate bridges, adapters, or controllers. Therefore, the bus 916 can include a system bus, a PCI bus or PCIe bus, a HyperTransport or industry standard architecture (ISA) bus, a small computer system interface (SCSI) bus, a USB, IIC (I2C) bus, or an Institute of Electrical and Electronics Engineers (IEEE) standard 1394 bus (also referred to as "Firewire").

In some embodiments the processing system 900 operates as part of a multi-node server platform (e.g., multi-node server platform 100 of FIG. 1), while in other embodiments the processing system 900 is connected (wired or wirelessly) to the multi-node server platform or individual multi-server sled(s).

The processing system 900 may be a server, a personal computer, a tablet computer, a laptop computer, a personal digital assistant (PDA), a mobile phone, a processor, a telephone, a web appliance, a network router, a switch, a bridge, a console, or any other machine capable of executing a set of instructions (sequential or otherwise) that specify actions to be taken by the processing system 900.

While the main memory 906, non-volatile memory 910, and storage medium 926 (also called a "machine-readable medium") are shown to be a single medium, the term "machine-readable medium" and "storage medium" should be taken to include a single medium or multiple media (e.g., a centralized/distributed database and/or associated caches and servers) that store one or more sets of instructions 928. The term "machine-readable medium" and "storage medium" shall also be taken to include any medium that is capable of storing, encoding, or carrying a set of instructions for execution by the processing system 900.

In general, the routines executed to implement the embodiments of the disclosure may be implemented as part of an operating system or a specific application, component, program, object, module or sequence of instructions referred to as "computer programs." The computer programs typically comprise one or more instructions (e.g., instructions 904, 908, 928) set at various times in various memory and storage devices in a computing device, and that, when read and executed by the one or more processors 902, cause the processing system 900 to perform operations to execute elements involving the various aspects of the disclosure.

Moreover, while embodiments have been described in the context of fully functioning computing devices, those skilled in the art will appreciate that the various embodiments are capable of being distributed as a program product in a variety of forms. The disclosure applies regardless of the particular type of machine or computer-readable media used to actually effect the distribution.

Further examples of machine-readable storage media, machine-readable media, or computer-readable media include, but are not limited to, recordable-type media including volatile and non-volatile memory devices 910, floppy and other removable disks, hard disk drives, optical disks (e.g., Compact Disk Read-Only Memory (CD ROMS), Digital Versatile Disks (DVDs)), and transmission-type media including digital and analog communication links.

The network adapter 912 enables the processing system 900 to mediate data in a network 914 with an entity that is external to the processing system 900 through any communication protocol supported by the processing system 900 and the external entity. The network adapter 912 can include one or more of a network adaptor card, a wireless network interface card, a router, an access point, a wireless router, a switch, a multilayer switch, a protocol converter, a gateway, a bridge, bridge router, a hub, a digital media receiver, and/or a repeater.

The network adapter 912 can include a firewall that governs and/or manages permission to access/proxy data in a computer network, and tracks varying levels of trust between different machines and/or applications. The firewall can be any number of modules having any combination of hardware and/or software components able to enforce a predetermined set of access rights between a particular set of machines and applications, machines and machines, and/or applications and applications (e.g., to regulate the flow of traffic and resource sharing between these entities). The firewall may additionally manage and/or have access to an access control list that details permissions including the access and operation rights of an object by an individual, a machine, and/or an application, and the circumstances under which the permission rights stand.

The techniques introduced here can be implemented by programmable circuitry (e.g., one or more microprocessors), software and/or firmware, special-purpose hardwired (i.e., non-programmable) circuitry, or a combination of such forms. Special-purpose circuitry can be in the form of, for example, one or more application-specific integrated circuits (ASICs), programmable logic devices (PLDs), field-programmable gate arrays (FPGAs), etc.

REMARKS

The foregoing description of various embodiments of the technology has been provided for the purposes of illustration and description. It is not intended to be exhaustive or to limit the claimed subject matter to the precise forms disclosed. Many modifications and variations will be apparent to one skilled in the art. Embodiments were chosen and described in order to best describe the principles of the technology and its practical applications, thereby enabling others skilled in the relevant art to understand the claimed subject matter, the various embodiments, and the various modifications that are suited to the particular uses contemplated.

Although the above Detailed Description describes certain embodiments and the best mode contemplated, no matter how detailed the above appears in text, the embodiments can be practiced in many ways. Details of the technology may vary considerably in its implementation details while still being encompassed by the specification. As noted above, particular terminology used when describing certain features or aspects of various embodiments should not be taken to imply that the terminology is being redefined herein to be restricted to any specific characteristics, features, or aspects of the technology with which that terminology is associated. In general, the terms used in the following claims should not be construed to limit the technology to the specific embodiments disclosed in the specification, unless those terms are explicitly defined herein. Accordingly, the actual scope of the technology encompasses not only the disclosed embodiments, but also all equivalent ways of practicing or implementing the embodiments covered by the claims.

The language used in the specification has been principally selected for readability and instructional purposes, and it may not have been selected to delineate or circumscribe the inventive subject matter. It is therefore intended that the scope of the technology not be limited by this Detailed Description, but rather by any claims that issue on an application based hereon. Accordingly, the disclosure of various embodiments is intended to be illustrative, but not limiting, of the scope of the technology.

What is claimed is:

1. A multi-node server platform, comprising:
   a cubby chassis including one or more partitions defining multiple sled slots, wherein the cubby chassis is configured to mount into a component rack; and
   multiple sleds located in the multiple sled slots, wherein each sled includes:
      a sled chassis having a sidewall and a bottom wall;
      a printed circuit board (PCB) assembly mounted to the sidewall of the sled chassis;
      a pair of card slots configured to receive modular cards that are each connected to the PCB assembly, wherein the pair of card slots are communicatively connected to each other via a Peripheral Component Interconnect Express (PCIe) bus; and
      a baseboard management controller (BMC) configured to
         collect system information from the pair of card slots,
         identify a current card configuration based on a type of modular card installed in each card slot as indicated by the system information, and
         determine, based on the current card configuration, whether to allow communications between the pair of card slots via the PCIe bus.

2. The multi-node server platform of claim 1, wherein the current card configuration comprises the modular cards being two one-socket server cards, and wherein the BMC prevents communication between the modular cards via the PCIe bus based on the current card configuration.

3. The multi-node server platform of claim 1, wherein the current card configuration comprises the modular cards being a one-socket server card and a device card, and wherein the BMC permits communication between the modular cards via the PCIe bus based on the current card configuration.

4. The multi-node server platform of claim 1, wherein the cubby chassis includes a power input connector that receives power from the component rack.

5. The multi-node server platform of claim 4, wherein each sled further includes:
   a power connector that interfaces with, and receives power from, a corresponding power connector of the cubby chassis; and
   multiple power switches corresponding to the pair of card slots, wherein the BMC independently delivers power from the power connector to the multiple power switches.

6. A baseboard for a multi-server sled, comprising:
   a printed circuit board (PCB) assembly;
   a pair of card slots configured to receive modular cards that are each connected to the PCB assembly, wherein the pair of card slots are communicatively connected to each other via a Peripheral Component Interconnect Express (PCIe) bus; and
   a baseboard management controller (BMC) that
      collects system information from the modular cards installed within the pair of card slots during initialization of the baseboard,
      automatically identifies a current card configuration based on a type of modular card installed in each card slot as indicated by the system information, and
      determines, based on the current card configuration, whether to allow communications between the pair of card slots via the PCIe bus.

7. The baseboard of claim 6, wherein the pair of card slots is one of multiple pairs of card slots on the baseboard.

8. The baseboard of claim 6, wherein the current card configuration is a first card configuration in which the pair of card slots includes a set of two one-socket server cards.

9. The baseboard of claim 8, wherein at least one one-socket server card of the set is configured to:
   disable a PCIe port corresponding to the PCIe bus to prevent communication via the PCIe bus; and
   properly configure one or more other PCIe ports to avoid collisions that are produced when server cards attempt to use each other as device cards.

10. The baseboard of claim 6, wherein the current card configuration is a second card configuration in which the pair of card slots includes a set of a one-socket server card and a device card.

11. The baseboard of claim 10, wherein the one-socket server card of the set is configured to:
   enable a PCIe port corresponding to the PCIe bus, which permits the one-socket server card to utilize the device card.

12. The baseboard of claim 6, wherein the BMC is directly accessible via a multi-host network interface card (NIC) connected to the PCB assembly, a Network Controller Sideband Interface (NC-SI), a System Management Bus (SMBus), or a combination thereof.

13. The baseboard of claim 6, wherein the BMC is connected to:
   a video graphics array (VGA) interface; and
   a Universal Serial Bus (USB) interface.

14. The baseboard of claim 6, further comprising:
a power connector that interfaces with a corresponding power connector of a cubby chassis within which the multi-server sled is installed, wherein the BMC independently delivers power received at the power connector to multiple power switches corresponding to the pair of card slots.

15. The baseboard of claim 6, further comprising:
a hot swap controller connected to the BMC, wherein the hot swap controller enables the modular cards to continue operating when the multi-server sled is pulled out of a cubby chassis for service.

16. The baseboard of claim 6, wherein the PCB assembly includes a Peripheral Component Interconnect (PCI) mezzanine card manufactured in accordance with the Institute of Electrical and Electronics Engineers (IEEE) P1386.1 standard.

17. A method of discovering a type of a modular card installed in a card slot of a baseboard, comprising:
initializing a baseboard management controller (BMC) of the baseboard;
detecting, by the BMC, a voltage available on a single pin of a Peripheral Component Interconnect Express (PCIe) bus corresponding to the card slot;
comparing the voltage to a specified threshold; and
determining, by the BMC, based on comparing the voltage to the specified threshold, whether the modular card is a server card or a device card.

18. The method of claim 17, further comprising:
responsive to a determination that the modular card is a server card,
collecting, by the BMC, system information from an electrically erasable programmable read-only memory (EEPROM) on the server card;
updating, by the BMC, the system information;
loading, by the BMC, the updated system information into the EEPROM of the server card; and
powering, by the BMC, the server card by providing power to a power switch corresponding to the card slot.

19. The method of claim 18, wherein powering the server card is performed:
responsive to receiving user input indicative of a request to activate the server card; or
in accordance with a specified power policy configuration.

20. The method of claim 18, wherein the BMC communicates with the server card via a bridge Integrated Circuit (IC) interface.

21. The method of claim 18, wherein the updated system information includes software-implemented pin assignment modifications to a PCIe standard employed by the server card.

22. The method of claim 21, wherein the software-implemented pin assignment modifications ensure the server card is able to engage necessary input/output (I/O) terminals, disengage incompatible I/O terminals, or both.

23. The method of claim 17, further comprising:
responsive to a determination that the modular card is a device card,
collecting, by the BMC, system information from an electrically erasable programmable read-only memory (EEPROM) on the device card; and
enabling, by the BMC, the device card to communicate with a server card installed on the baseboard via a Peripheral Component Interconnect Express (PCIe) bus.

24. The method of claim 17, further comprising:
analyzing, by the BMC, sensor data generated by one or more sensors disposed proximate to the baseboard to monitor a function status, a power status, a thermal status, or some combination thereof.

\* \* \* \* \*